US006405592B1

(12) United States Patent
Murari et al.

(10) Patent No.: US 6,405,592 B1
(45) Date of Patent: Jun. 18, 2002

(54) HERMETICALLY-SEALED SENSOR WITH A MOVABLE MICROSTRUCTURE

(75) Inventors: Bruno Murari, Monza; Benedetto Vigna, Potenza; Paolo Ferrari, Gallarate, all of (IT)

(73) Assignee: STMicrlelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/100,838

(22) Filed: Jun. 19, 1998

(30) Foreign Application Priority Data

Jun. 19, 1997 (EP) .............................. 97830290

(51) Int. Cl.[7] .......................... G01P 1/02; G01P 15/125
(52) U.S. Cl. ..................... 73/493; 73/514.32
(58) Field of Search ............................ 73/493, 514.32, 73/514.16, 514.29, 431, 718, 719, 720, 721, 724, 756, 754; 257/417, 415

(56) References Cited

U.S. PATENT DOCUMENTS

| | | | |
|---|---|---|---|
| 4,314,225 A | 2/1982 | Tominaga et al. | 338/4 |
| 4,399,707 A | 8/1983 | Wamstad | 73/727 |
| 4,528,853 A | 7/1985 | Lerch et al. | 73/624 |
| 5,111,693 A | 5/1992 | Greiff | 73/514 |
| 5,164,328 A | 11/1992 | Dunn et al. | 437/54 |
| 5,168,344 A | 12/1992 | Ehlert et al. | 257/693 |
| 5,259,247 A | 11/1993 | Bantien | 73/718 |
| 5,285,690 A | 2/1994 | Koen et al. | 73/727 |
| 5,438,859 A | * 8/1995 | Yamashita et al. | 73/514.34 |
| 5,650,567 A | * 7/1997 | Ueda et al. | 73/493 |
| 5,719,334 A | * 2/1998 | Parsons | 73/514.32 |
| 5,723,904 A | * 3/1998 | Shiga | 257/698 |
| 5,750,926 A | 5/1998 | Schulman et al. | 174/52.3 |
| 5,864,063 A | * 1/1999 | Otani et al. | 73/514.32 |

FOREIGN PATENT DOCUMENTS

| | | |
|---|---|---|
| EP | 0773443 A1 | 5/1997 |
| EP | 0732594 B1 | 11/1998 |
| WO | WO 96/39632 | * 12/1996 |

* cited by examiner

Primary Examiner—Helen Kwok
(74) Attorney, Agent, or Firm—Lisa Jorgenson; E. Russell Tarleton; SEED IP Law Group, PLLC

(57) ABSTRACT

A sensor with a movable microstructure including a sensitive element, formed in a first chip of semiconductor material for producing an electrical signal dependent on a movement of at least one movable microstructure relative to a surface of the first chip. The sensitive element is enclosed in a hollow hermetic structure, and circuitry for processing the electrical signal is formed in a second chip of semiconductor material. The hollow hermetic structure includes a metal wall disposed on the surface of the first chip around the sensitive element, and the second chip is fixed to the metal wall.

15 Claims, 1 Drawing Sheet

HERMETICALLY-SEALED SENSOR WITH A MOVABLE MICROSTRUCTURE

TECHNICAL FIELD

The present invention relates to a sensor with a movable microstructure.

BACKGROUND OF THE INVENTION

Sensors with movable microstructures such as, for example, inertial sensors which can measure a physical quantity relating to a movement of the sensor and produce an output signal dependent on the quantity are used in various applications, for example, in the automotive field for monitoring various devices such as air bags, anti-slip braking systems (ABS), and active suspensions, or in other fields such as consumer electronics, computers and the like. Sensors with movable microstructures are formed on a microscopic scale in chips of semiconductor material; a sensor of this type comprises a sensitive element which can produce an electrical signal relating to the movement of a microstructure movable relative to a surface of the chip.

In sensors with movable microstructures, the sensitive element has to be suitably protected by being enclosed in a hermetic structure to ensure that it operates in a controlled environment; this allows the microstructure of the sensitive element, which has a very small mass, to move with little resistance and minimal damping so as to ensure good sensitivity of the sensor. A sensor of this type also includes a circuitry which processes the electrical signal generated by the sensitive element and which, in turn, has to be encapsulated in a suitable container or package which protects the processing circuitry from external environmental conditions, ensuring that it operates correctly.

A known technique for protecting a sensor with a movable microstructure consists in the encapsulation of the sensitive element and the processing circuitry in a hermetic, for example, ceramic or metal package; the sensitive element and the processing circuitry can thus be incorporated in the same semiconductor chip.

However., this technique is extremely expensive, resulting in a high final product cost.

A different known technique consists in the production of a hollow structure on a microscopic scale (a micro-cavity) which houses the sensitive element. This isolation method involves micromachining of a silicon or glass chip which is then connected to the chip on which the sensitive element is formed, for example, by an anodic bonding technique; this technique allows inexpensive standard plastic packages to be used for encapsulating the final product. However, the known solution described above is quite complex and expensive. Moreover, this technique does not allow the sensitive element and the processing circuitry to be incorporated in the same chip since the bonding step requires the surfaces joined to be perfectly flat (with a peak-valley roughness of the order of a hundred angstroms); generally, the plate containing the sensitive element and that containing the processing circuitry are arranged side by side and are connected electrically by means of suitable metal wires.

The sensitive elements of sensors with movable microstructures are usually made in large numbers in several identical areas of a wafer of semiconductor material which are subsequently separated by a suitable cutting operation. The cutting is generally carried out by means of a high-velocity, water-cooled, diamond-blade saw. A further disadvantage of the known sensors is that, during the drying of the water used for cooling the blade, permanent sticking or "stiction" of the movable microstructure to an underlying surface of the semiconductor chip may occur. This physical phenomenon renders the sensor unusable.

SUMMARY OF THE INVENTION

According to principles of the present invention, a sensor is provided having a sensitive element in a first chip of semiconductor material. The sensitive element produces an electrical signal dependent on a movement of a movable microstructure relative to a surface of the first chip of semiconductor material. The sensitive element is enclosed in a hollow hermetic structure, and a processing circuit formed in the second chip of semiconductor material is coupled to receive and process the electrical signal from the sensitive element. The hermetic structure includes a metal wall around the sensitive element that is fixed between the first chip and the second chip.

The sensor with a movable microstructure according to an embodiment of the present invention is particularly compact, simple and inexpensive. This sensor permits the optional use of a plastic, and hence extremely inexpensive, package for encapsulating the final product.

A method of producing the sensor according to another embodiment of the present invention does not require micromachining of a further silicon or glass wafer or connection thereof to the wafer on which the sensitive elements are formed. Moreover, both of the semiconductor chips used in the structure of the present invention contain active elements (the sensitive element and the processing circuitry, respectively) so that there is no wastage of material.

DETAILED DESCRIPTION OF THE INVENTION

Figure 1:
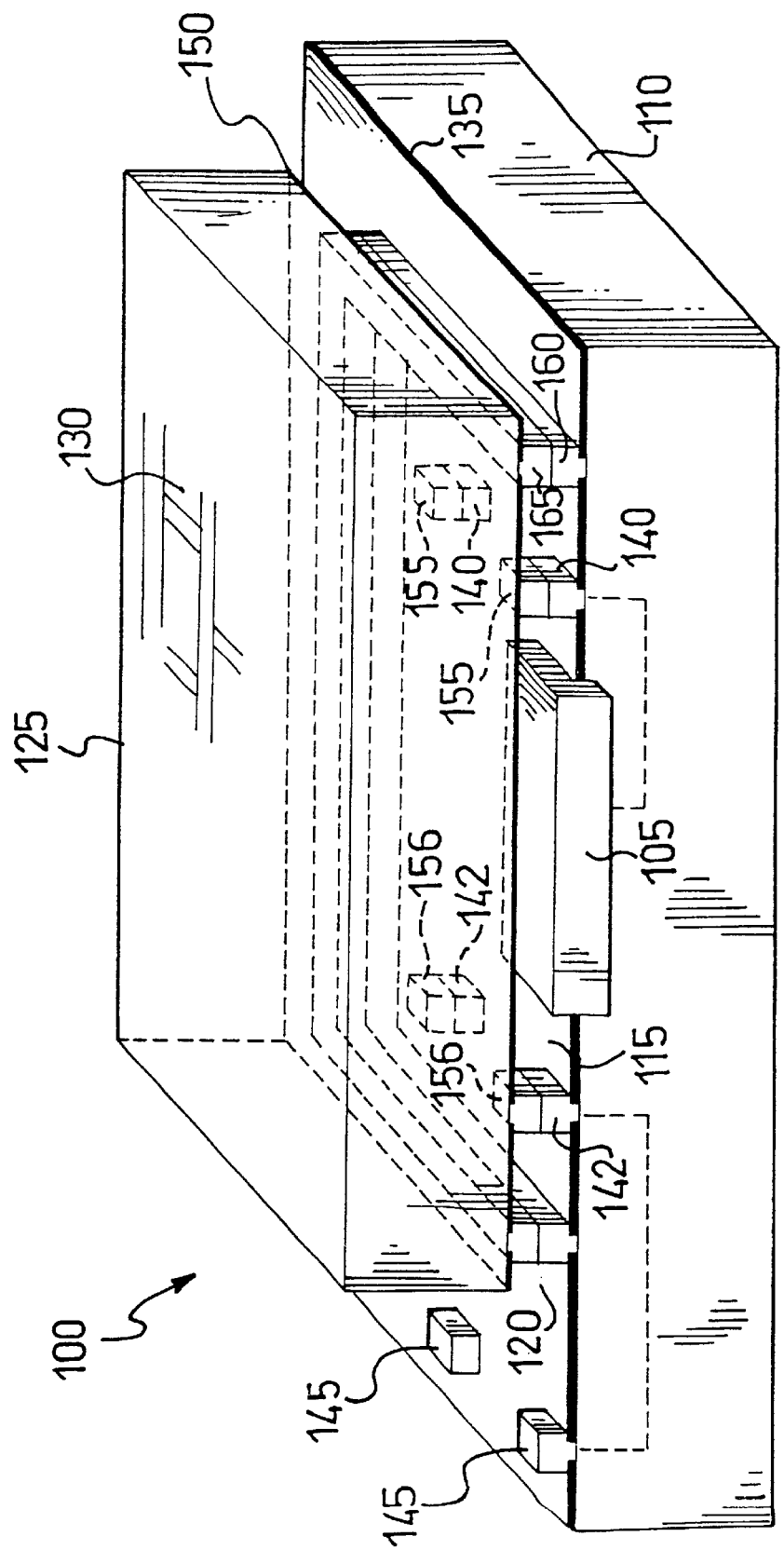
FIG. 1 shows a sensor in a partially-sectioned schematic view according to an embodiment of the present invention.

FIG. 1 shows a sensor 100 according to an embodiment of the present invention having a movable microstructure and, in particular, an inertial sensor comprising a sensitive element 105 which can detect a physical quantity relating to the inertia of one or more movable microstructures and can produce a corresponding electrical signal. The sensitive element 105 includes, for example, a micro-mechanical structure (a micro-electro-mechanical structure, or MEMS) formed on an upper surface of a chip 110 of semiconductor material, typically silicon. The sensitive element 105 generally has a seismic mass anchored to the chip 110 at predetermined points and movable relative thereto, its movement being converted into a suitable electrical signal. For example, the seismic mass may comprise a first electrode of a capacitor having a second electrode which is provided on the chip 110; a movement of the seismic mass brings about a change in the capacitance of the capacitor which in turn is measured by a suitable circuit. The sensor 100 may be, for example, an accelerometer, an angular velocity sensor (a gyroscope) or a vibration sensor, in which the microstructure of the sensitive element 105 moves as a result of linear/angular acceleration or of an angular velocity of a system (for example, a motor-car) on which it is mounted, enabling the desired physical quantity to be measured. In alternative embodiments of the present invention, the sensor is a resonant sensor in which the movable microstructure of the sensitive element 105 vibrates at a frequency which varies in dependence on the quantity to be detected.

The sensitive element 105 is sealed within a hollow hermetic structure 115 which protects the sensitive element 105 from microscopic particles and from damage resulting from assembly operations, as well as ensuring a leak tight structure with respect to an internal gas (for example, air or nitrogen, typically at a pressure lower than atmospheric pressure) for regulating the damping of the movable microstructure of the sensitive element 105. In the sensor 100 of the present invention, the hollow hermetic structure 115 is defined laterally by a wall 120 (formed, for example, of a metal such as aluminium, nickel, copper, or the like) which is disposed on the upper surface of the chip 110 around the sensitive element 105, the shape (for example, circular or rectangular) of which varies according to the shape of the sensitive element 105. The hollow hermetic structure 115 is closed at the top by a further chip of semiconductor material 125 (having a size at least equal to that of a cavity of the hermetic structure 115) which is fixed to the wall 120. Circuitry 130 for processing an electrical signal produced by the sensitive element 105 is integrated in the semiconductor chip 125 and, for example, can amplify, control, compensate, and calibrate the signal. It should be noted that the movable microstructure (enclosed in a metal cavity) is advantageously screened from electromagnetic interference, for example, by a connection of the chip 125 to a reference terminal or to ground.

Contact electrodes formed on the upper surface of the chip 110, which is covered with an insulating layer 135 (typically silicon dioxide), are comprised by one or more conductive pads 140, 142 (four in the embodiment shown in FIG. 1) arranged inside the hollow hermetic structure 115 and by one or more conductive pads 145 (two in the embodiment shown in FIG. 1) arranged outside the hollow hermetic structure 115. Similarly, contact electrodes comprised by one or more pads 155 and 156 (four in the embodiment shown in FIG. 1) are formed on a lower surface of the chip 125, which is covered by an insulating layer 150. Each of the pads 155, 156 formed on the chip 125 is arranged facing and connected to a corresponding pad 140, 142 formed on the chip 110. The pads 140 are connected electrically to the sensitive element 105 in order to transmit the electrical signal generated by the sensitive element 105 to the corresponding pads 155 and hence to the processing circuitry 130; the connection between the sensitive element 105 and the pads 140 is achieved, for example, by means of a low-resistance diffusion in the semiconductor chip 110 brought about before or after the growth of an epitaxial layer or by means of metal connections at a level below that at which the metal wall 120 is formed. The electrical signal processed by the circuitry 130 is transferred to the pads 142 by means of the corresponding pads 156.

The pads 142 are connected electrically to the pads 145 in a similar manner in order to transmit the processed electrical signal to an external circuit. Alternative embodiments of the present invention may be implemented with different methods of electrical connection between the chip containing the sensitive element and the chip containing the processing circuitry. For example, the contact electrodes connected to the sensitive element may be arranged outside the hermetic cavity and the contact electrodes connected to the processing circuitry may be arranged on the upper surface of the respective chip and then connected by means of metal wires.

The sensor 100 described above may be produced starting with a first semiconductor wafer on an upper surface of which a large number of sensitive elements 105 are formed by known micromachining techniques. A metallic aluminium layer (typically 1$\mu$m thick) is deposited on the entire upper surface of the wafer and the pads 140, 142, 145 and a lower frame 160, used (as described below) for forming the metal wall 120, are defined therein by known masking and selective etching techniques. The wafer is then covered with the insulating layer 135 in which openings or windows are similarly formed in the regions of the pads 140, 142, 145 and of the lower frame 160. A thin layer (a flash) of gold which protects against oxidation and improves the quality of the welding is preferably deposited on the pads 140, 142, 145 and on the lower frame 160.

A large number of processing circuits 130 corresponding to the sensitive elements 105 are formed in a second wafer by known integration techniques. The pads 155, 156 and an upper frame 165 used (as described below) to define the metal wall 120 are then formed in the manner described above. The invention may, however, also be implemented with the metal wall 120 formed entirely on a single wafer.

In an alternative embodiment of the present invention, the upper frame 165 (or alternatively, the lower frame 160 or both of the frames 160, 165) is subjected to a growth process in order to increase its thickness (similar remarks apply to the pads 140, 142 and 155, 156 which have to be connected to one another within the hollow hermetic structure 115). This additional step is useful when the height of the metal wall 120 produced by the process described above (generally 2–3$\mu$m) is not sufficient to ensure correct movement of the microstructure of the sensitive element 105. In particular, a projection (a bump) made, for example of nickel or copper, is grown on the upper frame 165 (and on the pads 155 and 156). This bump is formed by means of a non-electrolytic (electroless) growth process. In detail, a layer of more noble metal, for example zinc, is deposited and prevents the formation of oxide and hydroxide layers on the aluminium. The wafer is then immersed in an autocatalytic chemical solution in order to grow a layer of nickel; finally, a thin layer (a flash) of gold which protects against oxidation and improves the quality of the welding, is deposited. The process described above is particularly inexpensive and flexible since it is compatible with machining of the wafers in batches and does not require any additional masks. Alternatively, electro-deposition (electroplating), evaporation, or dispensing methods, and the like, are used.

The wafer containing the processing circuitry 130 is then cut to form the various chips 125. The chips 125 are fixed to the wafer (as yet uncut) containing the sensitive elements 105. In particular, the upper frame 165 and the pads 155,156 of each chip 125 are fixed to a corresponding lower frame 160 and to the corresponding pads 140, 142, respectively. For this purpose, a welding process, for example, a thermal compression process, in which the heated parts are joined simply by pressure, or a thermal-ultrasonic process which provides for the simultaneous application of heat and ultrasound, is preferably used. Alternatively, the fixing is achieved by different techniques, for example, with the use of a suitable adhesive.

Upon completion of the operations on the wafer containing the sensitive elements 105 (and the respective checking) this wafer is cut to form the various chips 110. The sensitive elements 105 are thus protected in the hollow hermetic structure 115 so that they are not damaged during the cutting operation and are not exposed to the danger of "stiction". This enables an extremely high production yield to be achieved.

The production of the sensor is then completed by known and conventional operations. Each chip 110 is fixed to a suitable frame by soldering with an alloy having a low melting point, for example, lead-tin, or by gluing with a suitable adhesive. The pads 145 are connected to the corresponding electrodes by means of thin metal, for example, gold wires. Typically, the metal wires are soldered to the pads 145 on the one hand and to the inner ends of the electrodes on the other hand with an alloy having a low melting point, by a thermal-ultrasonic method. The sensor unit thus produced can be used directly if it is fitted in a system in a controlled environment, as in hard-disk drivers. Alternatively, the unit may be mounted in a suitable die into which a plastic material, for example, a thermosetting epoxy resin, is injected in a liquid state. After polymerization of the resin, a device comprising an insulating body which incorporates the elements described above and from which the electrodes project for connection to an external circuit is thus produced. The sensor of the present invention may, however, also be used in different devices, for example, ball-grid array (or BGA) devices and the like.

Naturally, in order to satisfy contingent and specific requirements, an expert in the art may apply to the above-described sensor with a movable microstructure many modifications and variations all of which, however, are included within the scope of protection of the invention as defined by the following claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A sensor with a movable microstructure, comprising a sensitive element formed in a first chip of semiconductor material for producing an electrical signal dependent on a movement of at least one movable microstructure relative to a surface of the first chip, the sensitive element being enclosed in a hollow hermetic structure formed by a second chip of semiconductor material attached to the first chip of semiconductor material over the sensitive element, and a processing circuit for processing said electrical signal formed in the second chip of semiconductor material and in electrical connection with the electrical signal produced by the sensitive element formed in the first chip, the hollow hermetic structure including a metal wall disposed on a surface of the first chip around the sensitive element, the second chip being fixed to said wall.

2. The sensor according to claim 1 wherein the metal wall is comprised substantially of nickel.

3. The sensor according to claim 1, further comprising at least one first conductive pad formed on the surface of the first chip within the hollow hermetic structure and connected electrically to the sensitive element, each at least one first conductive pad being connected to a second, facing conductive pad formed on a surface of the second chip for transmitting the electrical signal to the processing circuit.

4. The sensor according to claim 3, further comprising at least one third conductive pad formed on the surface of the first chip within the hollow hermetic structure, each at least one third pad being connected to a fourth, facing conductive pad formed on the surface of the second chip for receiving an electrical signal processed by the processing circuitry.

5. The sensor according to claim 4, further comprising at least one fifth conductive pad formed on the surface of the first chip outside the hollow hermetic structure, each at least one fifth pad being connected electrically to a corresponding sixth pad for transmitting the processed electrical signal outside of the sensor.

6. The sensor according to claim 1 wherein the sensor comprises an inertial sensor.

7. An electronic device comprising the sensor according to claim 1 and a plastic package in which the sensor is encapsulated.

8. A sensor comprising:

a first chip of semiconductor material;

a sensor element having a movable microstructure, the sensor element supported by the first chip and structured to generate a first signal in response to a movement of the microstructure relative to the first chip;

a second chip of semiconductor material covering the sensor element and configured to receive the first signal, the second chip of semiconductor material comprising a processing circuit formed therein and electrically coupled to the sensor element to receive the first signal, the processing circuit structured to process the first signal and generate a second signal based on the first signal; and a wall formed on the first chip and surrounding the sensor element and connecting the first chip to the second chip, the wall defining a hermetically sealed chamber between the first chip and the second chip and enclosing the sensor element.

9. The sensor according to claim 8 wherein the wall is comprised of a metal.

10. The sensor according to claim 8 wherein the processing circuit is formed in the second chip.

11. The sensor according to claim 8, further comprising:

a plurality of conductive pads connected between the first chip and the second chip; and a low resistance diffusion in the first chip between the sensor element and the pads.

12. The sensor according to claim 11, further comprising at least one output terminal outside the sealed chamber and coupled to the processing circuit to receive the second signal.

13. The sensor according to claim 8 wherein the sensor element comprises an inertial sensor.

14. The sensor according to claim 8 wherein the sensor element comprises a resonant sensor.

15. The sensor according to claim 8 wherein the sealed chamber encloses a gas at a pressure below atmospheric pressure.

* * * * *

UNITED STATES PATENT AND TRADEMARK OFFICE
CERTIFICATE OF CORRECTION

PATENT NO.     : 6,405,592 B1
DATED          : June 18, 2002
INVENTOR(S)    : Bruno Murari et al.

It is certified that error appears in the above-identified patent and that said Letters Patent is hereby corrected as shown below:

<u>Title page,</u>
Item [73], "STMicrlelectronics S.r.l." should read as -- STMicroelectronics S.r.l. --.

<u>Column 6,</u>
Line 33, "a hermetically scaled chamber" should read as -- a hermetically sealed chamber --.
Lines 51 and 52, "the sensor clement" should read as -- the sensor element --.

Signed and Sealed this

Twenty-second Day of October, 2002

*Attest:*

JAMES E. ROGAN
*Attesting Officer*          *Director of the United States Patent and Trademark Office*

(12) EX PARTE REEXAMINATION CERTIFICATE (9599th)
United States Patent
Murari et al.

(10) Number: US 6,405,592 C1
(45) Certificate Issued: Apr. 15, 2013

(54) HERMETICALLY-SEALED SENSOR WITH A MOVABLE MICROSTRUCTURE

(75) Inventors: Bruno Murari, Monza (IT); Benedetto Vigna, Potenza (IT); Paolo Ferrari, Gallarate (IT)

(73) Assignee: STMicroelectronics S.r.l., Agrate Brianza (IT)

Reexamination Request:
No. 90/012,497, Sep. 11, 2012

Reexamination Certificate for:
Patent No.: 6,405,592
Issued: Jun. 18, 2002
Appl. No.: 09/100,838
Filed: Jun. 19, 1998

Certificate of Correction issued Oct. 22, 2002

(30) Foreign Application Priority Data

Jun. 19, 1997 (EP) .................................. 97830290

(51) Int. Cl.
*G01B 7/00* (2006.01)
*G01C 19/00* (2006.01)
*G01P 1/02* (2006.01)
*G01P 9/04* (2006.01)
*G01P 15/08* (2006.01)

(52) U.S. Cl.
USPC ......................................... 73/493; 73/514.32

(58) Field of Classification Search ....................... None
See application file for complete search history.

(56) References Cited

To view the complete listing of prior art documents cited during the proceeding for Reexamination Control Number 90/012,497, please refer to the USPTO's public Patent Application Information Retrieval (PAIR) system under the Display References tab.

*Primary Examiner* — Margaret Rubin

(57) ABSTRACT

A sensor with a movable microstructure including a sensitive element, formed in a first chip of semiconductor material for producing an electrical signal dependent on a movement of at least one movable microstructure relative to a surface of the first chip. The sensitive element is enclosed in a hollow hermetic structure, and circuitry for processing the electrical signal is formed in a second chip of semiconductor material. The hollow hermetic structure includes a metal wall disposed on the surface of the first chip around the sensitive element, and the second chip is fixed to the metal wall.

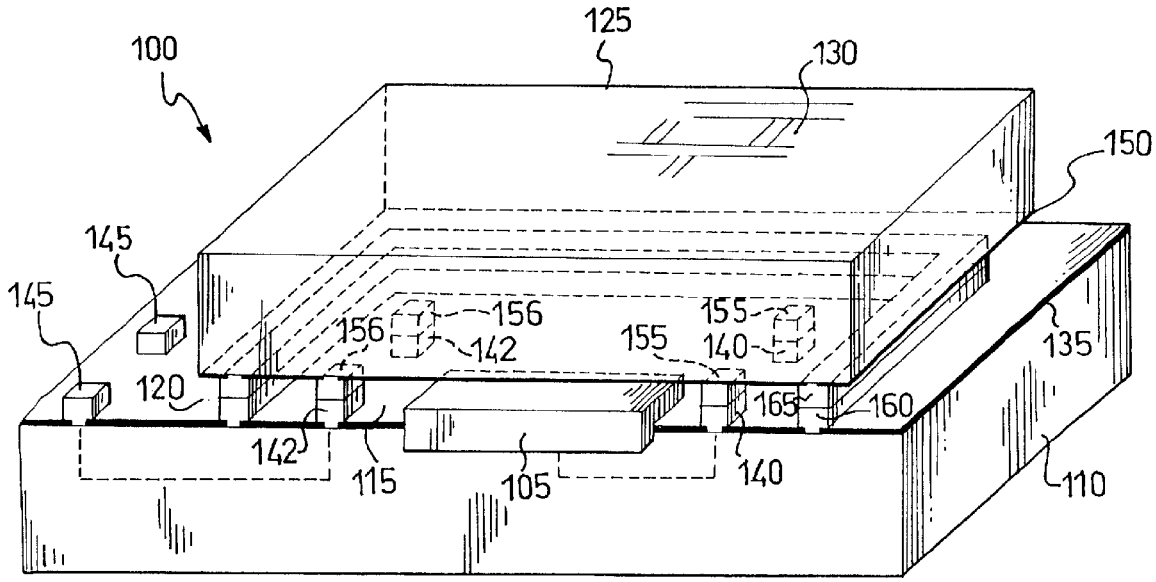

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-15 is confirmed.

\* \* \* \* \*

(12) EX PARTE REEXAMINATION CERTIFICATE (10885th)
United States Patent
Murari et al.

(10) Number: US 6,405,592 C2
(45) Certificate Issued: Jun. 13, 2016

(54) HERMETICALLY-SEALED SENSOR WITH A MOVABLE MICROSTRUCTURE

(75) Inventors: Bruno Murari, Monza (IT); Benedetto Vigna, Potenza (IT); Paolo Ferrari, Gallarate (IT)

(73) Assignee: STMicroelectronics, Inc.

Reexamination Request:
No. 90/012,982, Sep. 9, 2013

Reexamination Certificate for:
Patent No.: 6,405,592
Issued: Jun. 18, 2002
Appl. No.: 09/100,838
Filed: Jun. 19, 1998

Reexamination Certificate C1 6,405,592 issued Apr. 15, 2013

Certificate of Correction issued Oct. 22, 2002

(30) Foreign Application Priority Data

Jun. 19, 1997 (EP) ........................... 97830290

(51) Int. Cl.
G01P 15/08 (2006.01)
G01P 1/08 (2006.01)
G01P 1/00 (2006.01)
B81C 1/00 (2006.01)
G01P 1/02 (2006.01)

(52) U.S. Cl.
CPC .............. *B81C 1/0023* (2013.01); *G01P 1/02* (2013.01); *G01P 15/0802* (2013.01)

(58) Field of Classification Search
None
See application file for complete search history.

(56) References Cited

To view the complete listing of prior art documents cited during the proceeding for Reexamination Control Number 90/012,982, please refer to the USPTO's public Patent Application Information Retrieval (PAIR) system under the Display References tab.

*Primary Examiner* — Albert J Gagliardi

(57) ABSTRACT

A sensor with a movable microstructure including a sensitive element, formed in a first chip of semiconductor material for producing an electrical signal dependent on a movement of at least one movable microstructure relative to a surface of the first chip. The sensitive element is enclosed in a hollow hermetic structure, and circuitry for processing the electrical signal is formed in a second chip of semiconductor material. The hollow hermetic structure includes a metal wall disposed on the surface of the first chip around the sensitive element, and the second chip is fixed to the metal wall.

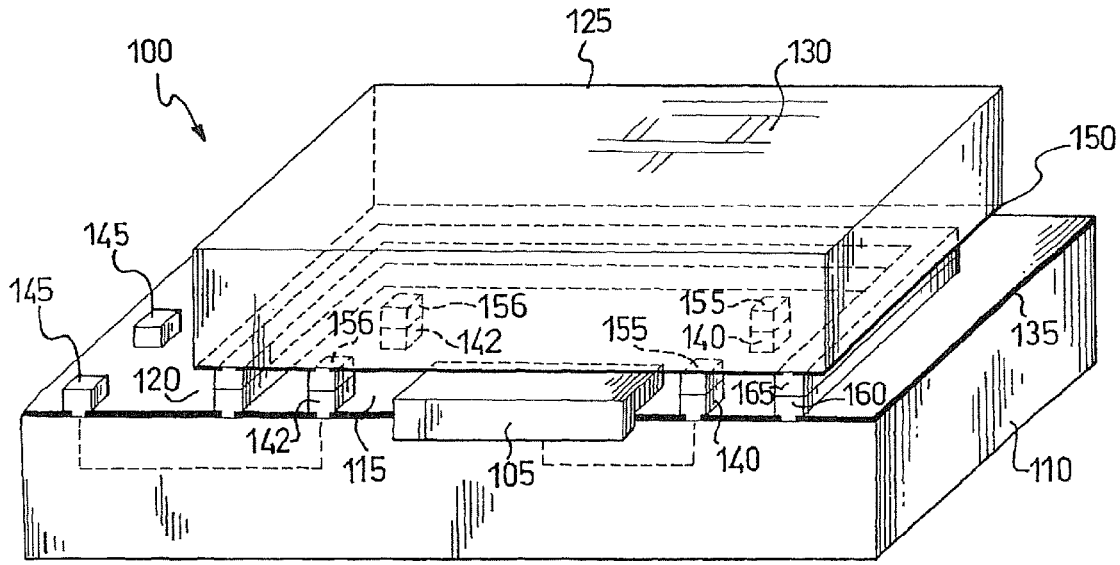

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-15 are cancelled.

New claims 16 and 17 are added and determined to be patentable.

*16. A sensor with a movable microstructure, comprising a sensitive element formed in a first chip of semiconductor material for producing an electrical signal dependent on a movement of at least one movable microstructure relative to a surface of the first chip, the sensitive element being enclosed in a hollow hermetic structure formed by a second chip of semiconductor material attached to the first chip of semiconductor material over the sensitive element, and a processing circuit for processing said electrical signal formed in the second chip of semiconductor material and in electrical connection with the electrical signal produced by the sensitive element formed in the first chip, the hollow hermetic structure including a metal wall disposed on a surface of the first chip around the sensitive element, the second chip being fixed to said wall, wherein the sensitive element extends above the surface of the first chip in the space between the first and second chips defined by the metal wall, and wherein the hollow hermetic structure encloses a gas at a pressure below atmospheric pressure.*

*17. The sensor of claim 16, wherein the height of the metal wall is based, at least in part, on an amount of space between the first and second chips needed to house the sensitive element and enable movement of the movable microstructure within the hollow hermetic structure.*

\* \* \* \* \*